(12) United States Patent
Suetsugu et al.

(10) Patent No.: US 7,540,078 B1
(45) Date of Patent: Jun. 2, 2009

(54) METHOD FOR RECYCLING WASTES OF AN ELECTRICAL APPLIANCE

(75) Inventors: Kenichiro Suetsugu, Nishinomiya (JP); Shunji Hibino, Hirakata (JP); Masato Hirano, Toyonaka (JP); Atsushi Yamaguchi, Mino (JP); Mikiya Nakata, Suita (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 09/889,167

(22) PCT Filed: Jan. 7, 2000

(86) PCT No.: PCT/JP00/00058

§ 371 (c)(1),
(2), (4) Date: Jul. 11, 2001

(87) PCT Pub. No.: WO00/42829

PCT Pub. Date: Jul. 20, 2000

(30) Foreign Application Priority Data

Jan. 11, 1999 (JP) ................................. 11-004411

(51) Int. Cl.
*H01R 43/00* (2006.01)
(52) U.S. Cl. ..................... 29/825; 29/426.3; 29/426.4; 29/426.5; 75/392; 75/403; 420/562; 702/82; 340/10.4; 340/10.41; 340/10.42; 340/10.52
(58) Field of Classification Search .................. 29/825, 29/426.3–426.5; 75/403, 392; 420/562; 702/82; 340/10.4, 10.41, 10.42, 10.52
See application file for complete search history.

(56) References Cited

U.S. PATENT DOCUMENTS 5,547,134 A * 8/1996 Rubenstein ................... 241/23
5,629,981 A * 5/1997 Nerlikar ....................... 713/168
5,654,902 A * 8/1997 Scheidt et al. .................. 702/82
5,667,156 A * 9/1997 Chapman .................. 241/24.13
5,743,936 A    4/1998 Yokoyama et al.

(Continued)

FOREIGN PATENT DOCUMENTS

DE           4424385         *   1/1996

(Continued)

OTHER PUBLICATIONS

Japanese Office Action issued in corresponding Japanese Patent Application No. 2000-005804 dated Feb. 15, 2007.

(Continued)

*Primary Examiner*—Thiem Phan
(74) *Attorney, Agent, or Firm*—McDermott Will & Emery LLP

(57) ABSTRACT

A recycling method of wastes of an electrical appliance containing an article having a circuit soldered with parts soldered with a lead free solder. The method includes discriminating a first article having a circuit soldered with lead free parts from a second article having a circuit soldered with lead containing parts; recovering, grinding and melting each of the first and second articles to separate materials of the first article and materials of the second article; recycling reusable valuables contained in the materials of the first article and second article; and shredding a portion of the first and second article not containing the reusable valuables and burying/treating the portion at a stabilizing dumping ground or a controlled dumping ground for disposal.

2 Claims, 13 Drawing Sheets

U.S. PATENT DOCUMENTS

| | | | |
|---|---|---|---|
| 5,942,185 A * | 8/1999 | Nakatsuka et al. | 420/562 |
| 6,226,617 B1 | 5/2001 | Suzuki | |
| 6,457,632 B1 | 10/2002 | Teshima | |
| 6,651,870 B2 | 11/2003 | Teshima | |
| 6,705,509 B2 | 3/2004 | Tada et al. | |

FOREIGN PATENT DOCUMENTS

| | | | |
|---|---|---|---|
| EP | 0831683 | | 3/1998 |
| FR | 2724529 | | 3/1996 |
| JP | 56-37693 A | | 4/1981 |
| JP | 07-066512 | | 3/1995 |
| JP | 07-326834 | * | 12/1995 |
| JP | 8-8500 A | | 1/1996 |
| JP | 09-103761 | * | 4/1997 |
| JP | 9-155327 A | | 6/1997 |
| JP | 9-262573 | | 10/1997 |
| JP | 10-303518 A | | 11/1998 |
| JP | 11-34058 | | 2/1999 |
| JP | 2001-77489 | | 3/2001 |
| KR | 1998-043002 | | 8/1998 |

OTHER PUBLICATIONS

Japanese Office Action issued in corresponding Japanese Patent Application No. 2000-005804, dated Jun. 19, 2006.

* cited by examiner

METHOD FOR RECYCLING WASTES OF AN ELECTRICAL APPLIANCE

CROSS-REFERENCE TO RELATED APPLICATION

This application is the U.S. National Phase under 35 U.S.C. 371 of International Application PCT/JP00/00058, filed Jan. 7, 1999, which claims priority to JAPAN Patent Application No. HEI11-004411, filed Jan. 11, 1999.

TECHNICAL FIELD

The present invention relates to an article having a circuit soldered with parts facilitating efficient recycling and an electrical appliance including the same, and a method for recycling wastes of the same.

BACKGROUND ART

Solders used during a mounting step of a part such as optical part (or device) and electronic part onto an article such as printed board, film board and housing or enclosure having a circuit normally contain a large quantity of lead.

Therefore, when articles having a circuit soldered with parts by using a solder or electrical appliances comprising the same are placed outdoors as wastes after use and weather-exposed, or are ground and buried for disposal, there arises a risk of groundwater pollution by the lead contained in the solder dissolving from the wastes.

Since the use of such lead-polluted groundwater as drinking water produces hazardous effects on human body, how to treat electrical appliance junks has become a current issue of significance.

Conventionally, in order to prevent pollution by lead, the electrical appliance is disassembled primarily to collect the article having a circuit, which is contained in the appliance, and a lead containing solder is isolated in junking or recycling the electrical appliance. The remaining parts are then ground into small pieces to separate materials or are buried at a controlled dumping ground, which is designed to best obviate leakage or draining of polluted water.

In order to prevent environmental pollution by such hazardous lead, there is a demand for full recycling of lead or discontinuing the use of lead.

In order to realize a circulating economical community, it has been planned to impose a duty on every manufacturer in year 2,001 to take back used electrical appliances for return and recycling them.

Under the circumstance, however, as shown in FIG. 4, the article having a circuit using the lead containing solder and electrical appliances comprising such article (hereinafter simply referred to as "lead containing article") on one hand, and the article having a circuit soldered with parts using a lead free solder and electrical appliances comprising such article (hereinafter simply referred to as "lead free article") on the other hand have been manufactured and sold on the market at the same time. As a result, the two types of articles coexist on the market and are recovered as they are. The recovered articles are directly conveyed to a nearby controlled dumping ground or stabilizing dumping ground, or are treated for recycling. It is noted that the printed board and film board are contained inside the electrical appliance.

At the controlled dumping ground, the recovered articles are buried as they are without any treatment. However, at the stabilizing dumping ground, the recovered articles are treated to prevent them from scattering, flying or migrating before they are buried.

When recycled, on the other hand, the recovered articles are disassembled, and if contained, lead is isolated to make them harmless. Then, reusable materials are selected for recycling.

A method of simply burying mixed wastes of the lead containing article and the lead free article at the controlled dumping ground is easy and simple in operation but has a high construction cost, producing a problem of high treatment cost.

A method of burying the waste without recycling reusable material at a dumping ground has a problem in the aspect of effective use of resources. This method has another problem that the dumping ground itself is being saturated with supra-maximal wastes.

Moreover, isolation and recovery of the solder by disassembling only the waste of the lead containing article from the mixed wastes of the lead containing article and the lead free article is not feasible and requires not only a specific instrument and an investment therefor but also a specific additional working step, which increases the treatment cost.

If the lead free article only can be recovered from among the mixed waste, it becomes possible to bury it at the stabilizing dumping ground with low construction cost by simply grinding the article. Therefore, identification and separation between the lead free article and the lead containing article among the miscellaneous recovered wastes can reduce the cost for disposal.

Under the circumstance, however, such identification takes much time and labor and has poor efficiency. Therefore, a simple means for identifying the lead free article from the lead containing article has been desired for.

In view of the above-mentioned problems, a primary object of the present invention is to provide an article having a printed board which facilitates identification whether lead is contained or not and an electrical appliance including the same.

Another object of the present invention is to provide a recycling method of the same.

DISCLOSURE OF INVENTION

The article having a circuit with parts, which are soldered by a lead free solder in accordance with the present invention has identification information of identification marking, bar code or IC which indicates presence or absence of lead in the article, in which the identification information carries information about the composition of the solder to enable identification of the type of solder.

In a preferred mode of the present invention, the bar code or IC carries information about the type and composition of solder, kind of soldered parts, and a material of the article.

The electrical appliance in accordance with the present invention comprises an article having a circuit with parts soldered with a lead free solder and a housing accommodating the article, wherein the housing carries identification information indicating presence or absence of lead, the identification information carrying information about the composition of the solder to enable identification of the type of solder.

The recycling method of wastes of an electrical appliance comprising an article having a circuit with parts soldered with a lead free solder and a housing accommodating the article wherein the housing carries identification information indicating presence or absence of lead, the identification information carrying information about the composition of the solder to enable identification of the type of solder, the method comprising:

identifying wastes of lead free electrical appliance from those of various electrical appliances based on the information about identification.

Further, the present invention relates a recycling method of wastes of electrical appliance containing an article having a circuit with parts soldered with a lead free solder and a housing accomodating the article wherein the housing carries identification information indicating presence or absence of lead, the identification information carrying information about the composition of the solder to enable identification of the type of solder, the method comprising:

discriminating an article having a circuit soldered with lead free parts from an article having a circuit soldered with lead containing parts by means of an identification marking provided on the article, recovering, grinding and melting each of discriminated articles to separate materials constituting the article, recycling reusable valuables contained in the materials, and shredding the rest of the article and buring the same or treating the same at a stabilizing dumping ground or a controlled dumping ground for disposal.

Still further, the present invention relates a recycling method of wastes of electrical appliance containing an article having a circuit with parts soldered with a lead free solder and a housing accomodating the article wherein said housing carries identification information indicating presence or absence of lead, the identification information carrying information about the composition of the solder to enable identification of the type of solder, the method comprising:

classifying wastes of miscellaneous electrical appliances by the type of electrical appliance, identifying the presence or absence of lead by means of the identification marking to discriminate a lead free elestrical appliance from a lead containing article, and disassembling each electrical appliance to remove an article having a circuit soldered with parts therefrom, discriminating an article having a circuit soldered with lead free parts from an article having a circuit soldered with lead containing parts by means of an identification marking provided on the article, recovering, grinding and melting each of discriminated articles to separate materials constituting the article, recycling reusable valuables contained in the materials, and shredding the rest of the article and buring the same or treating the same at a stabilizing dumping ground or a controlled dumping ground for disposal.

In the above electrical appliance, the identification information is preferably a labelling carried on the housing.

BEST MODE FOR CARRYING OUT THE INVENTION

As illustrated above, the present invention is characterized by attaching information about identification indicating no use or inclusion of lead in an article such as a circuit board like printed board and film board soldered with parts using a lead free solder, a housing having a circuit formed thereon, or a housing of an electrical appliance comprising the article having a circuit.

In the present invention, a "article having a circuit soldered with parts" conceptually includes an article such as printed board, film board and housing having a circuit, onto which an optical part and/or an electrical part is/are soldered.

In the following, the present invention will be described more specifically by means of embodiments, taking an identification marking as representative.

Figure 5:
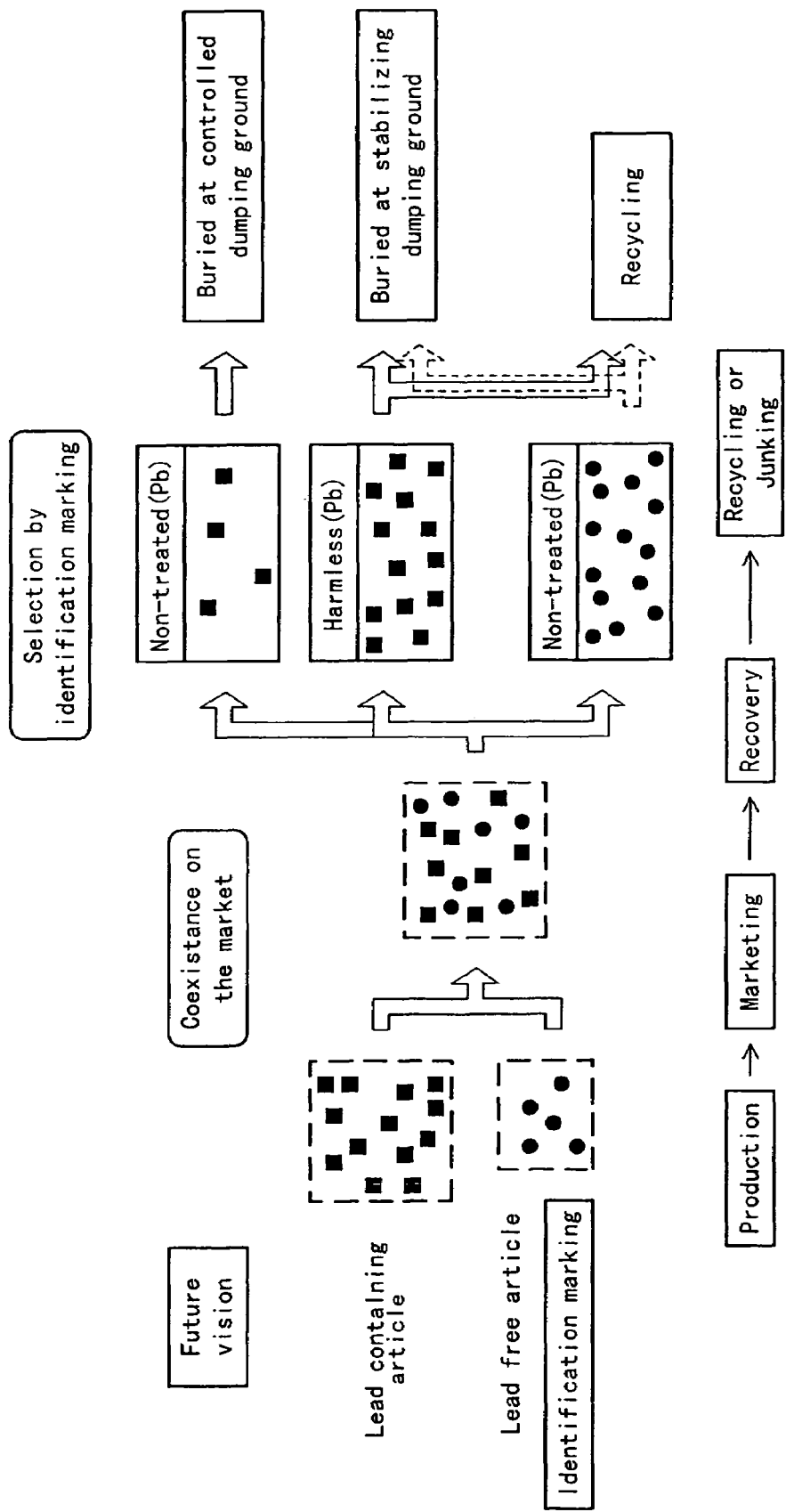
FIG. 5 is a flow chart illustrating a series of processes of manufacturing, marketing, recovering and junking an article in accordance with the present invention.

As shown in FIG. 5, the identification marking enables simple and easy identification between the lead free article and the lead containing article among miscellaneous wastes recovered in situ from the market.

The lead free article contains an extremely low percentage of poisonous lead to human body. Therefore, even if buried as it is, the lead free article can have an only slight effect on human body and can, therefore, be recycled by simply grinding it to separate reusable materials without necessitating isolation and recovery of the solder. The remaining non-reusable materials can be buried at the stabilizing dumping ground having low cost.

The identification marking can restrict the treatment for making an article harmless by disassembling it to isolate and remove lead only to the lead containing article. This in turn reduces the volume of wastes to be buried at the costly controlled dumping ground.

As such, the present invention can reduce both the recycling and junking cost of wastes.

It is preferred that a part to be soldered on the article having a circuit such as printed board has a lead free electrode having a coating of a lead free solder, because this can still minimize the content of lead in the resultant article having a circuit and enhance the strength of an electrode-lead free solder junction thereby elongating the life of the article.

When the part to be soldered on the printed board is a part such as hybrid IC, which is formed by soldering an IC chip or a capacitor on the board, then the use of lead free solder for soldering the IC chip or capacitor can eliminate lead from the resultant article having a circuit perfectly. Such lead free article also may carry a similar identification marking to the above which serves as identification information.

Parts to be soldered onto printed boards and the like may be exemplified as semiconductor, resistor, capacitor, coil, switch, LED, oscillator, connector, liquid crystal, transducer, etc.

A method for attaching the identification marking is not limited particularly if the method allows the attachment to the printed board, housing or the like and gives an identification marking which would remain recognizable without going out with time. Exemplary effective methods are printing, inscribing and labelling. More specifically, a method as appropriate may be selected according to the material of a part to which the identification marking is to be attached.

The printed board may be composed of a material including a resin such as phenolic resin, epoxy resin, polyimide resin or polyester resin, a metal such as iron, copper, aluminum alloy, ceramics such as alumina or glass, or paper. The printed board may optionally contain a glass cloth. The printed board may contain one or more of the exemplified material.

The housing is composed of a material including a metal such as iron, aluminum, magnesium alloy, a resin such as polypropylene, polystyrene, ABS resin, polycarbonate, ceramics or wood. The housing may contain one or more of the exemplified material.

Exemplary applicable printing methods include painting, stamping, ink jet and so on. These methods are preferable because they can be integrated with a conventional marking process such as printing a lot number, printing a visual design, etc. Of them, painting integrated with visual design printing on the housing is particularly desirable because it is hard to go out.

The use of a fluorescent paint as ink is also preferred, because it facilitates simple and rapid identification of a mass of wastes using an optical sensor.

Inscribing can be performed concurrently with article design printing at the time of molding the housing of an article or otherwise at a final step. Inscribing is preferred, because it does not require a tedious step and is hard to go out.

Labelling is preferred, because it readily permits uniformity of identification marking among a variety of electrical appliances and among miscellaneous manufacturers, thereby further facilitating identification at recycling operation.

In attaching the identification marking to the electrical appliance, it may be carried on either the article having a circuit like printed board or the housing or on the both. However, in the aspect of eliminating an additional subsequent disassembling step, it is more convenient to carry the identification marking at least on the housing.

The present invention also provides a method of recycling wastes of the article having a circuit and a recycling method of wastes of the electrical appliance, the recycling method comprising a step of identifying the lead free article having a circuit from among recovered miscellaneous wastes of articles having a circuit or identifying the lead free electrical appliance from among recovered miscellaneous wastes of electrical appliances with the aid of identification marking, in order to isolate the former for recycling.

In the following, the present invention will be described taking the use of identification marking having information about identification as representative.

In recycling the wastes of the article having a circuit attached with the identification marking and the electrical appliance comprising the same, the identification marking helps to identify and select only the lead free article from among the mixed wastes of the lead free article and the lead containing article.

Selection of the wastes by the identification marking is preferable, because it expedites recycling operation.

Selection of the wastes by the identification marking attached to the housing of the electrical appliance can also omit the additional subsequent disassembling step.

Selection of the wastes can be performed by various methods: manual selection based on a determination using the identification marking, selection of the wastes using a sensor which can recognize the identification marking, such as inspection camera, by conveying the wastes on a conveyor belt, etc.

Marking for identification can be carried out in various ways as shown below.

(1) Bonding an Identification Label on a Board

Figure 6:
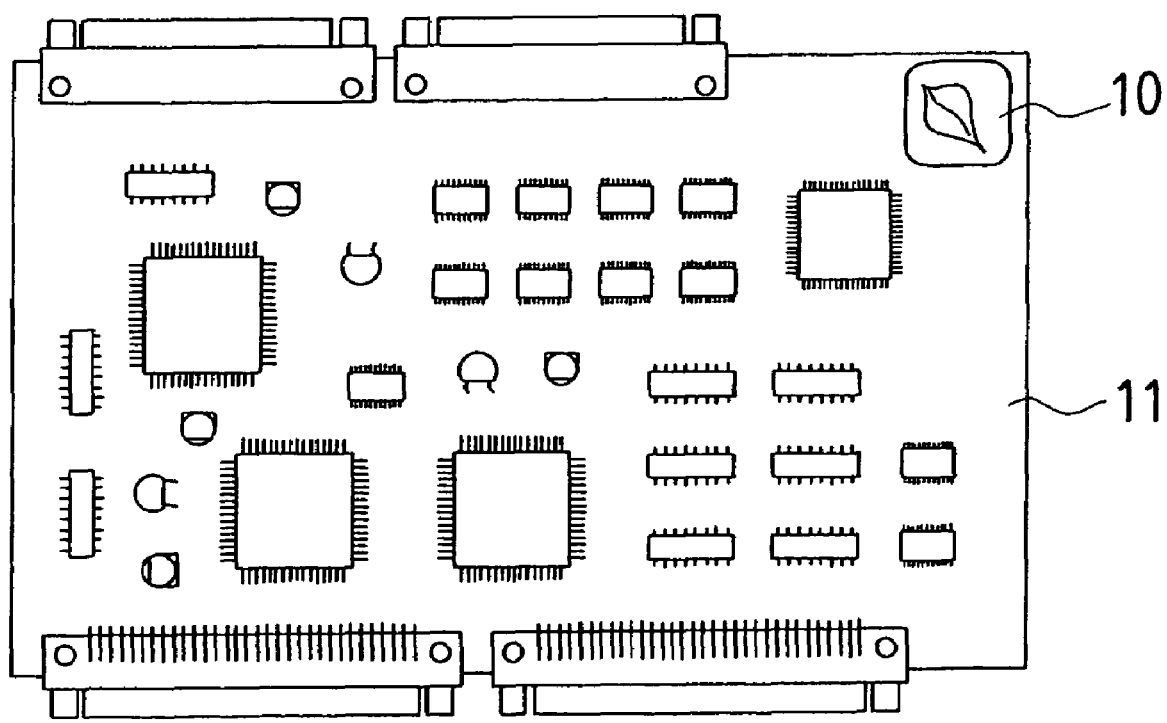
FIG. 6 is an upper view of a board with an attached identification label.

FIG. 6 is an upper view of a board 10 with an identification label 11 by bonding it to the board.

An identification label is bonded to a board or on a space between large parts on the board. The use of a fluorescent ink as the printing ink for the label enables automatic determination of the presence or absence of the label by a combination of a darkroom and a inspection camera during recycling process.

Written information as to what kind of solder is used, Sn—Ag, Sn—Ag—Bi. Sn—Cu or Sn—Zn for example, enables identification of the board including the lead containing solder as well as identification and separation of boards by the type of solder. Treatment of the board by the type of solder during recovery of solder increases the purity of solder as recovered and enables recovery of valuables having a high addition value. It is also effective to vary the color of identification label by the type of solder.

If the identification marking is varied in color, it becomes possible to separate the used solder by the type apparently. If a metal contained in the recovered waste is to be refined for recycling, since the used metal has been separated by the type of material, it becomes possible to recycle a more refined metal. If different boards having a variety of solders are refined at the same time, the resultant refined product contains a variety of components, rendering recycling of the product difficult. Although the identification label is varied in color here, a symbol such as ◯ and x may be attached.

As such, a provision of a character, color or symbol in the identification marking enables recycling the waste in a short time with high accuracy, thereby increasing recycling efficiency.

(2) Printing on a Board

Figure 7:
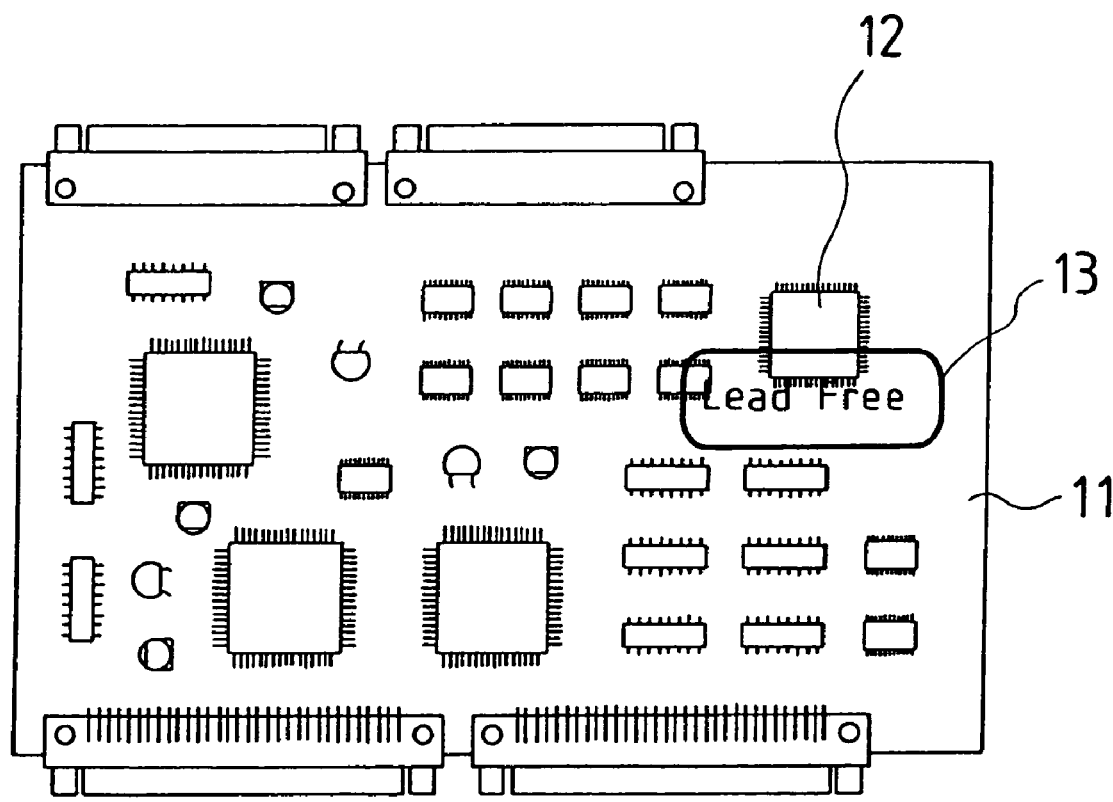
FIG. 7 is an upper view of a board with a printed identification marking.

FIG. 7 is an upper view of a board with an identification marking 13 by printing it on the board by means of ink jetting or stamping.

As shown in FIG. 7, the use of ink jetting enables printing the identification marking from above a part 12 on the board.

Since ink jetting does not greatly restrict the shape of board and arrangement of parts and allows free choice of the type of character, it becomes possible to print an identification marking that can identify the type of used solder as in the bonding method explained in the above paragraph (1).

The use of stamping enables lower cost printing than the ink jetting.

As in the above (1), the use of a fluorescent ink as printing ink renders automatic determination of the presence or absence of the identification marking feasible by a combination of a darkroom and a inspection camera during recycling process.

(3) Printing an Identification Marking on a Board During its Manufacturing Process This method permits in situ application of a general process for marking an indication of parts during board manufacturing process without an additional step for marking the identification marking using a specific identification marking apparatus. This results in an advantage of low manufacturing cost.

Figure 8:
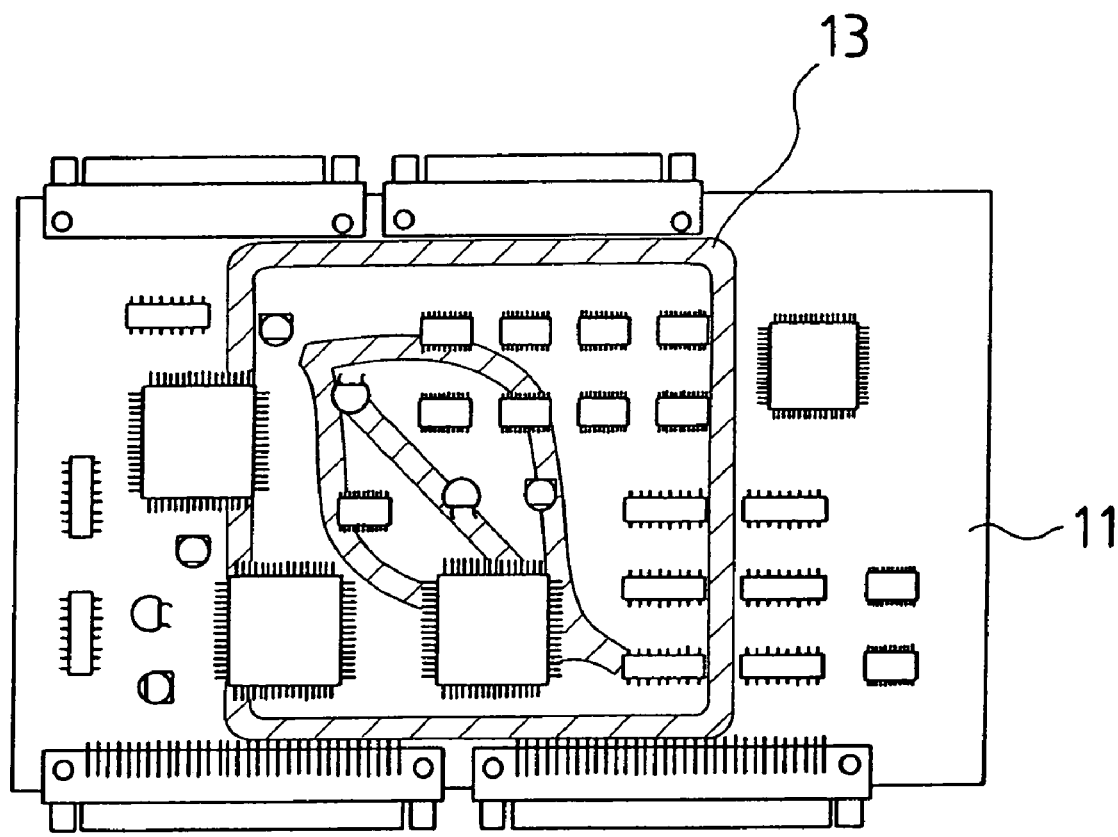
FIG. 8 is an upper view of another board with a printed identification marking.

FIG. 8 is an upper view of another board with the identification marking 13 by printing it directly on the board. Direct printing on the board enables printing a large identification marking over the entire board regardless of the position of parts. This makes recycling operation feasible.

(4) Varying Board Color

The board generally has a green color which is a resist color of the solder. In the present invention, colors other than green, such as blue, red, black, etc., for example, are used for the resist to facilitate identification during recycling process.

The board and resist normally contain a halogen element which can be an environmental loading substance, so that they can become an origin of hazardous dioxin when they are burnt. This has accelerated commercialization of a board containing no halogen element, that is, halogen free board. Since a green dye used in the conventional resist of the solder contains the halogen element, it has been contemplated to use a different color, such as blue, for the resist in replacing a halogen containing board with the halogen free board.

As such, if the lead free solder is combined with the halogen free board, then it becomes possible to know at first sight that the resultant board is less environmentally loading, facilitating separation of the board for treatment.

(5) Bonding an Inscribed Copper Foil

This method mimics the above-described method of bonding an identification label but uses an inscribed copper foil as an identification marking during board manufacturing process. This method has low cost because it enables bonding the identification marking during routine board manufacturing process without an additional marking instrument for bonding the identification marking.

Figure 9:
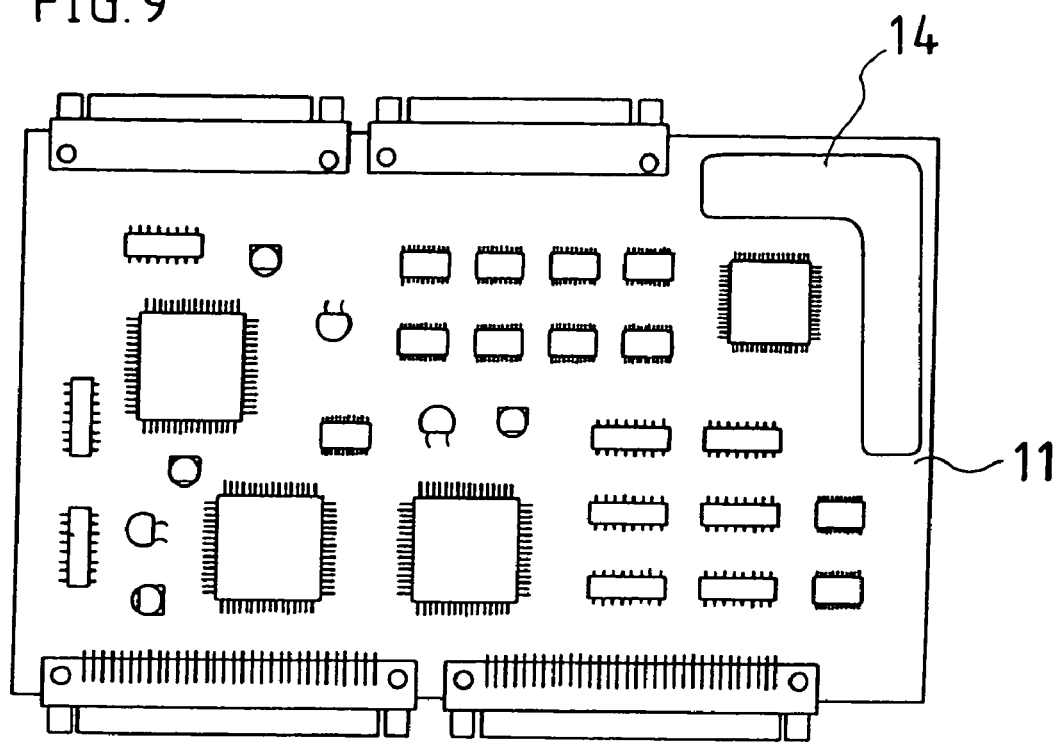
FIG. 9 is an upper view of a board with an attached copper foil having a punched character as an identification marking.

FIG. 9 is an upper view of a board 11 with an inscribed copper foil 14 by bonding it on the board.

(6) Disposing an Identification Bar Code

This method attaches a bar code label as an identification marking on the board or housing or prints a bar code directly on the board or housing. This method facilitates automatic determination whether the board is lead free or not by using a bar code reader. This method is also advantageous in that the volume of information can be increased compared with the method of identification by character or color.

Particularly, when a control system for controlling identification operation of the article having a circuit and the electrical appliance is employed, it is possible to store a data base in the control system to check a bar code number. The use of a two-dimensional bar code can increase the volume of information carried on the bar code, enabling control of more pieces of information.

If the volume of information can be increased, it is possible to process detailed information on, for example, material of housing, material of board, material of soldered parts, etc. in addition to the solder composition and ratio of the components. Controllability of detailed information would in turn enables selection of the treatment method according to the type of poisonous substance contained in parts, as well as identification of the presence or absence of lead in the waste during recycling operation. As a result, environmental pollution due to innocence of the presence of hazardous substance can be prevented.

Furthermore, this method can not only increase the value of recycling materials and improve the recycling yield by enabling recovery of all valuables, such as nobel metal, contained in the waste without fail and separation of the waste by the type of plastics used in the housing.

Figure 10:
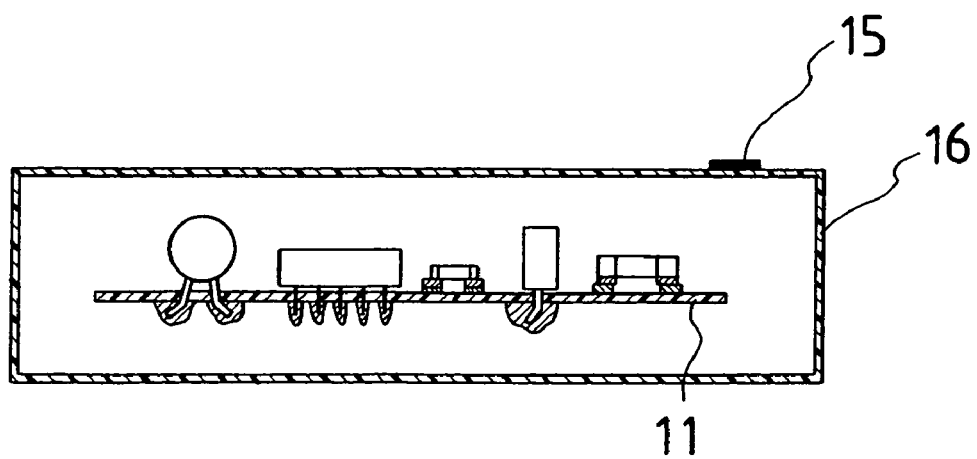
FIG. 10 is a cross-sectional view schematically illustrating an electrical appliance including a housing having a bar code as an identification marking.
Figure 11:
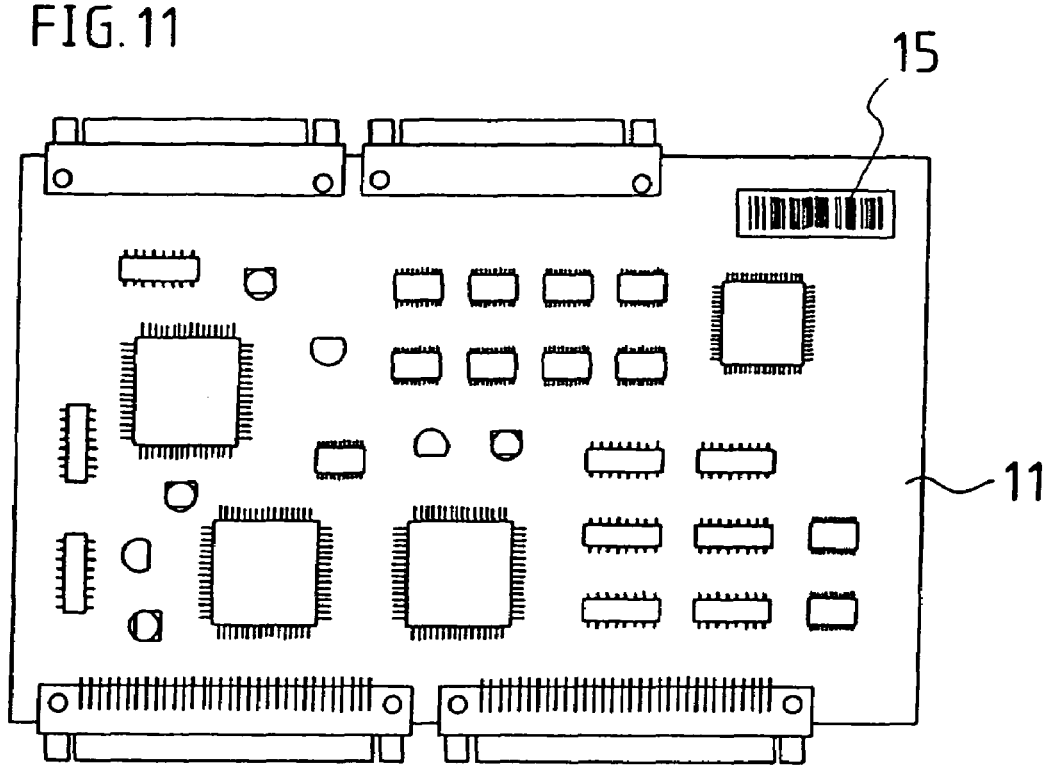
FIG. 11 is an upper view of a board having a bar code as an identification marking.

FIG. 10 illustrates a housing 16 of an article having a board 11 soldered with a variety of parts to which a bar code 15 is attached. FIG. 11 illustrates the board 11 to which the bar code 15 is directly attached.

(7) Using an Identification IC

This method attaches a non-contact reading type IC to the article having a circuit as an identification marking. This method enables identification between the lead free article and the lead containing article by passing them near a data reader. This method reduces restriction to the attachable site of IC and enables arbitrarily attachment of the identification IC to either the board or the housing.

This means that this method renders control of recycling of the article having a circuit and the electrical appliance including the same feasible, resulting in efficient recycling in a short time. This method also has excellent reliability with respect to identification because it is less susceptible to the influence of dirt or stain than an optical reading method using a bar code.

The identification IC has another advantage of eliminating subsequent attaching step as required by the bar code, because it can be additionally soldered during soldering other parts to the board. If the identification IC is RAM, it is reusable.

The IC can store more pieces of information. If the volume of information can be increased, it is possible to process detailed information on, for example, material of housing, material of board, material of soldered parts, etc. in addition to the solder composition and ratio of its components. Controllability of detailed information would in turn enables selection of the treatment method according to the type of poisonous substance contained in parts, as well as identification of the presence or absence of lead in the waste during recycling operation. As a result, environmental pollution due to innocence of the presence of hazardous substance can be prevented.

Furthermore, this method can not only increase the value of recycling materials and improve the recycling yield by enabling recovery of all valuables, such as nobel metal, contained in the waste without fail and separation of the waste by the type of plastics used in the housing.

Figure 12:
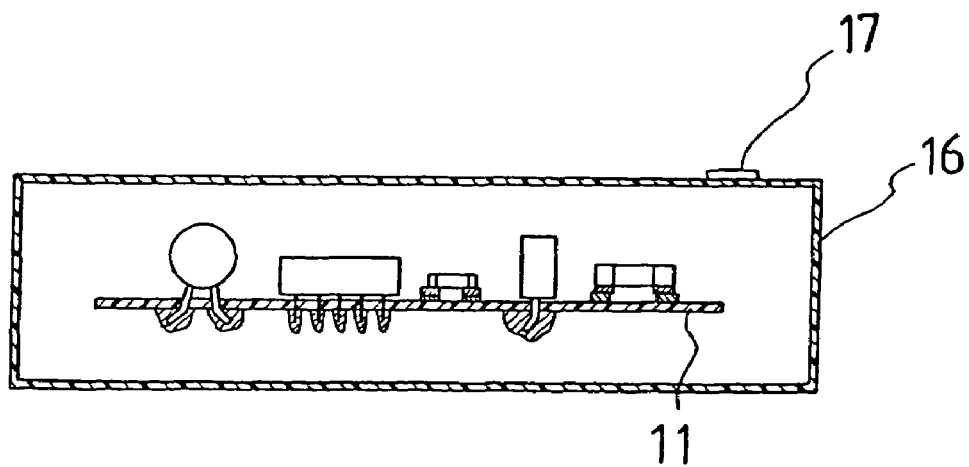
FIG. 12 is a cross-sectional view schematically illustrating an electrical appliance including a housing having an identification IC as an identification marking.
Figure 13:
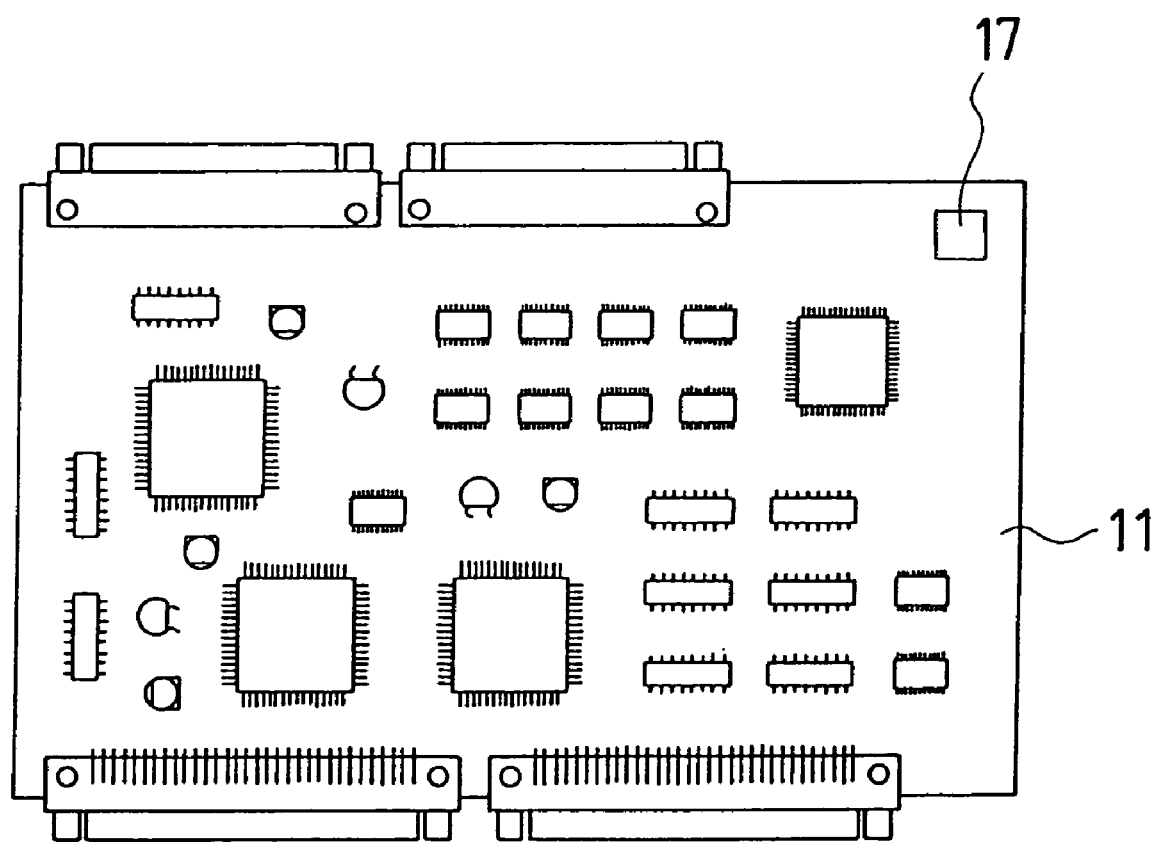
FIG. 13 is an upper view of a board having an IC as an identification marking.

FIG. 12 is a schematic view of the housing 16 of an article having the board 11 soldered with a variety of parts to which an identification IC 17 is bonded. FIG. 13 is an upper view of the board 11 soldered with a variety of parts to which the identification IC 17 is directly bonded.

The recycling method of the wastes of the electrical appliance containing the article having a circuit in accordance with the present invention has the following advantages:

Recycling operation for the article having a circuit can be performed by a series of system to the final stage of treatment.

Information about identification carried on the bar code and IC enables treatment of the housing, the board and the article having a circuit as appropriate. For example, it is possible to recycle an expensive IC and extract a material like palladium contained in the coating of electrodes of various parts from a molten solder material.

As the electrical appliance, household electrical appliances, such as audiovisual equipment, refrigerator, air conditioner, washing machine, lighting fixture, etc., information-associated OA equipment, such as computer, telephone, copier and facsimile, vehicle electric components, industrial machinery electric components, plant instrument electric components, and construction electric components.

Figure 14:
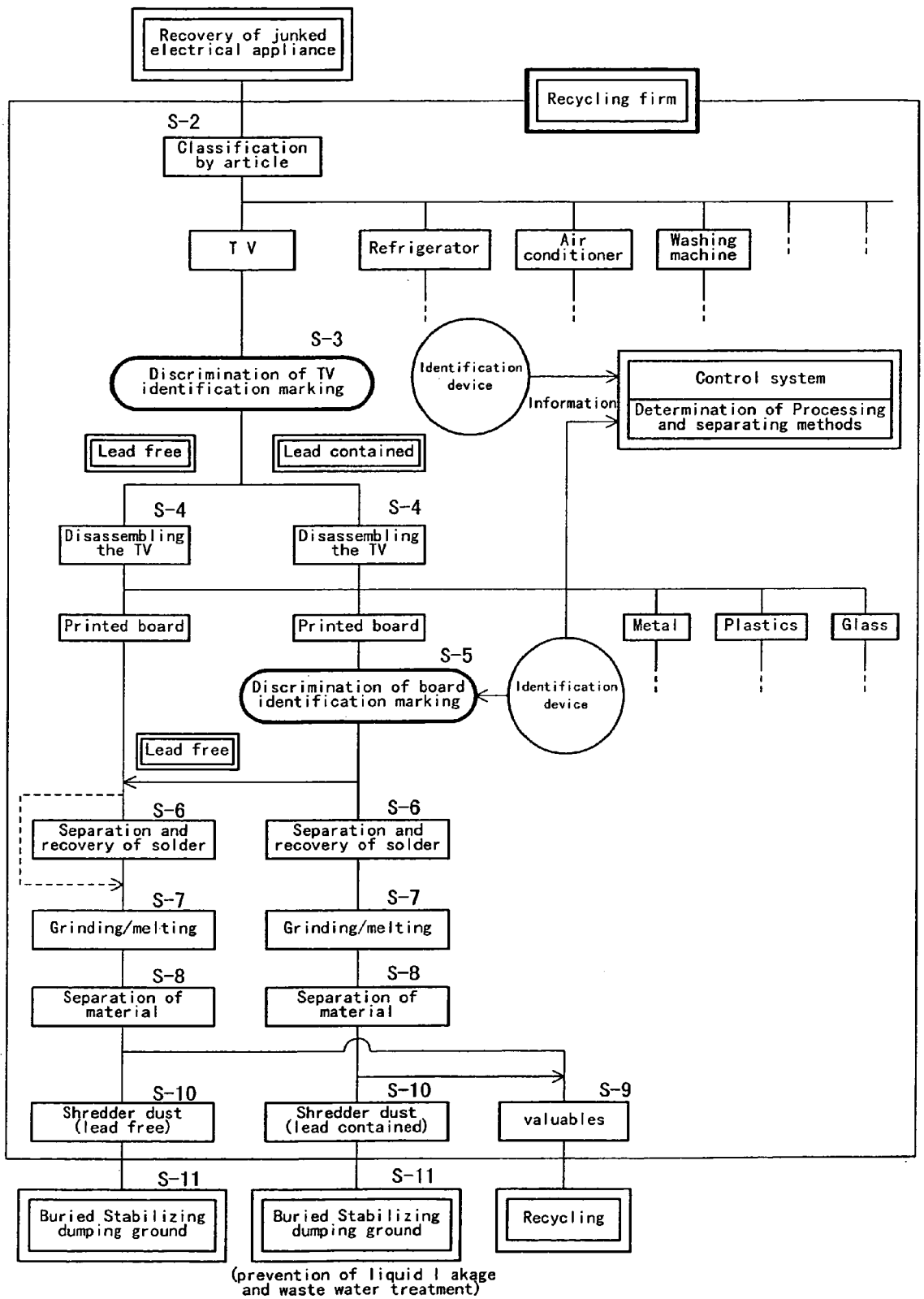
FIG. 14 is a flow chart illustrating a recycling method of an electrical appliance in accordance with the present invention.

FIG. 14 shows a flow chart of one example of the recycling method of the article having a circuit and/or the electrical appliance in accordance with the present invention. The recycling method of the present invention will be described along the flow chart.

Wastes of the electrical appliance are recovered (s-1) and classified by the type (s-2). Although the subsequent step is identical between all the concerned electrical appliances, description will be made on a television set here.

The identification marking attached to the television set is used to identify whether it contains lead or not in order to separate it from the lead containing article (s-3).

Then, all the separated televisions are disassembled to remove printed boards (s-4). In this disassembling step, it is desirable to remove and separate at the same time metals, glass, plastics, etc. constituting the television.

Then, since the lead containing article may sometimes include a board using a lead free solder, the lead free board is separated from the lead containing board by the identification marking attached to the printed board (s-5).

Subsequently, the lead containing board and the lead free board are individually recovered (s-6), ground and molten (s-7) for separation of the material (s-8).

Reusable valuables such as gold are recycled (s-9) and, after being treated, the lead free board or the lead containing board is individually shredded (s-10), buried or treated appropriately at the stabilizing dumping ground or controlled dumping ground (s-11).

Figure 15:
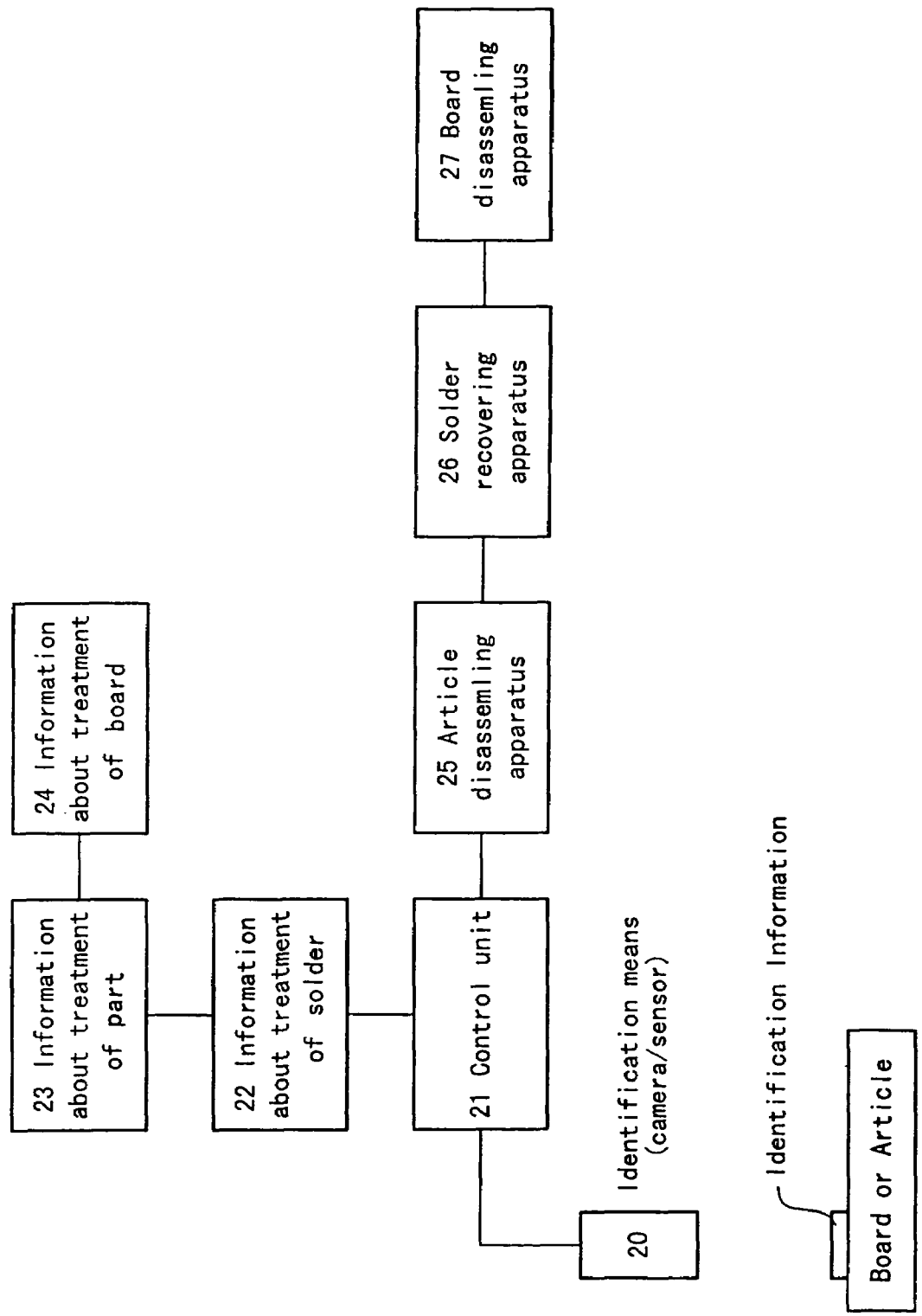
FIG. 15 is a picture illustrating a structure of one example of a recycling apparatus applicable to the recycling method in accordance with the present invention.

As the recycling system applied to the recycling method of the present invention can be exemplified as one shown in FIG. 15. The recycling system comprises identification means 20 for recognizing and identifying information about identification, such as identification marking and bar code, carried on the board or electrical appliance. A control unit 21 reads information 22 about treatment of the solder based on the information given by the identification means 20, such as method of recovering the solder or melting condition of the solder, information 23 about treatment of part, such as method and condition of treating soldered parts, and information 24 about treatment of board, in order to control an article disassembling apparatus 25, a solder recovering and/or material separating apparatus 26 and a board disassembling apparatus 27 so that recovery and disassembly can be optimally carried out by the type of treating object, such as solder, part and board. For example, IC which is a soldered part is separated for reuse and a material contained in the electrode of part, such as palladium, is extracted from the molten solder.

In the following, the present invention will be described more specifically referring to concrete examples.

EXAMPLE 1

Figure 1:
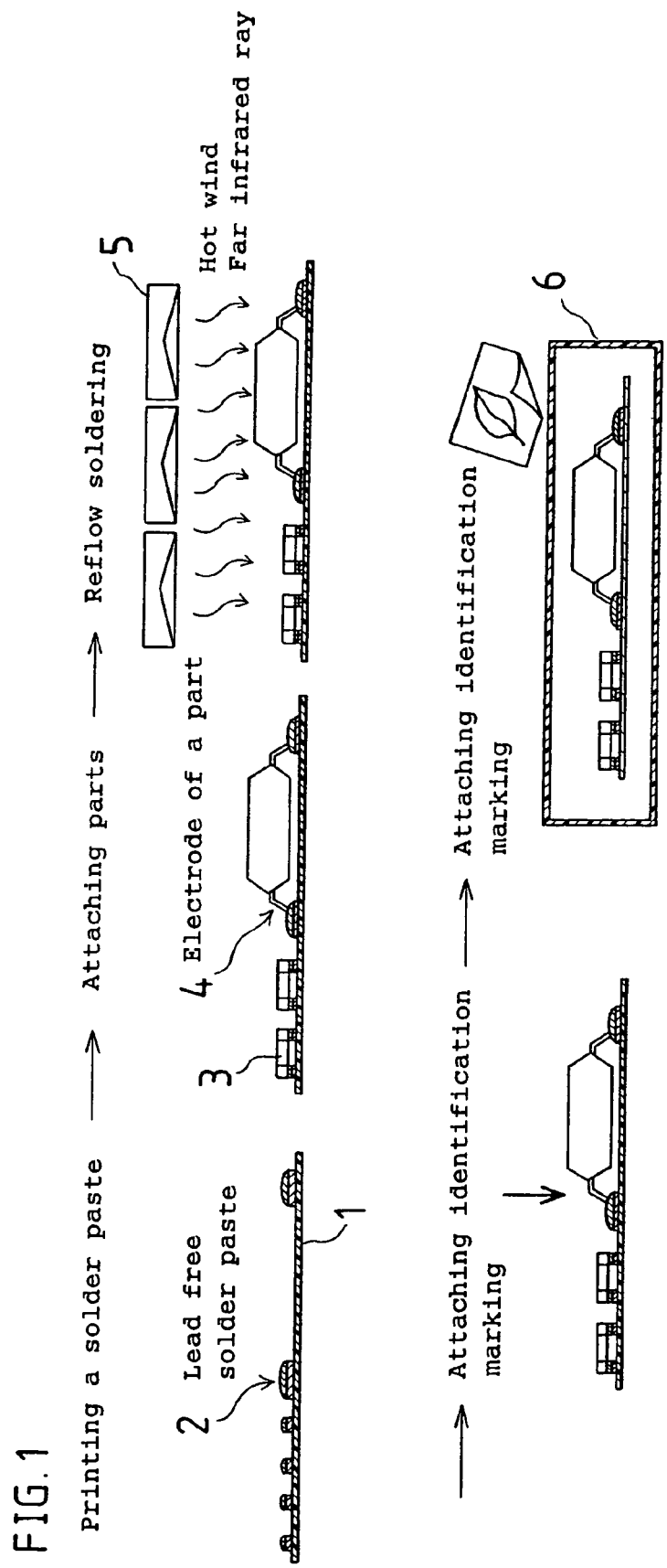
FIG. 1 is a picture illustrating the steps of a soldering method of various parts on a printed board for use in portable minidisk (MD) players by means of reflow soldering process.

FIG. 1 is a picture illustrating the steps of a soldering method of various parts on a printed board for use in portable MD players by means of reflow soldering process.

First, a lead free solder paste 2 was printed on an electrode of a printed board 1. A variety of parts 3 were then arranged on the printed paste such that an electrode 4 of a part was opposed to the printed board 1. Subsequently, the solder paste was molten by using hot wind or far infrared ray as a heat source 5 to solder the parts (this method is called reflow soldering). Then, a label was bonded to the printed board 1 as an identification marking indicating no inclusion of lead. An identical label was also bonded to a housing 6 of an article containing the printed board 1 thus produced.

The resultant MD player could be readily identified to be free of lead by the identification marking when it was recovered after use, which simplified the subsequent recycling process.

EXAMPLE 2

Figure 2:
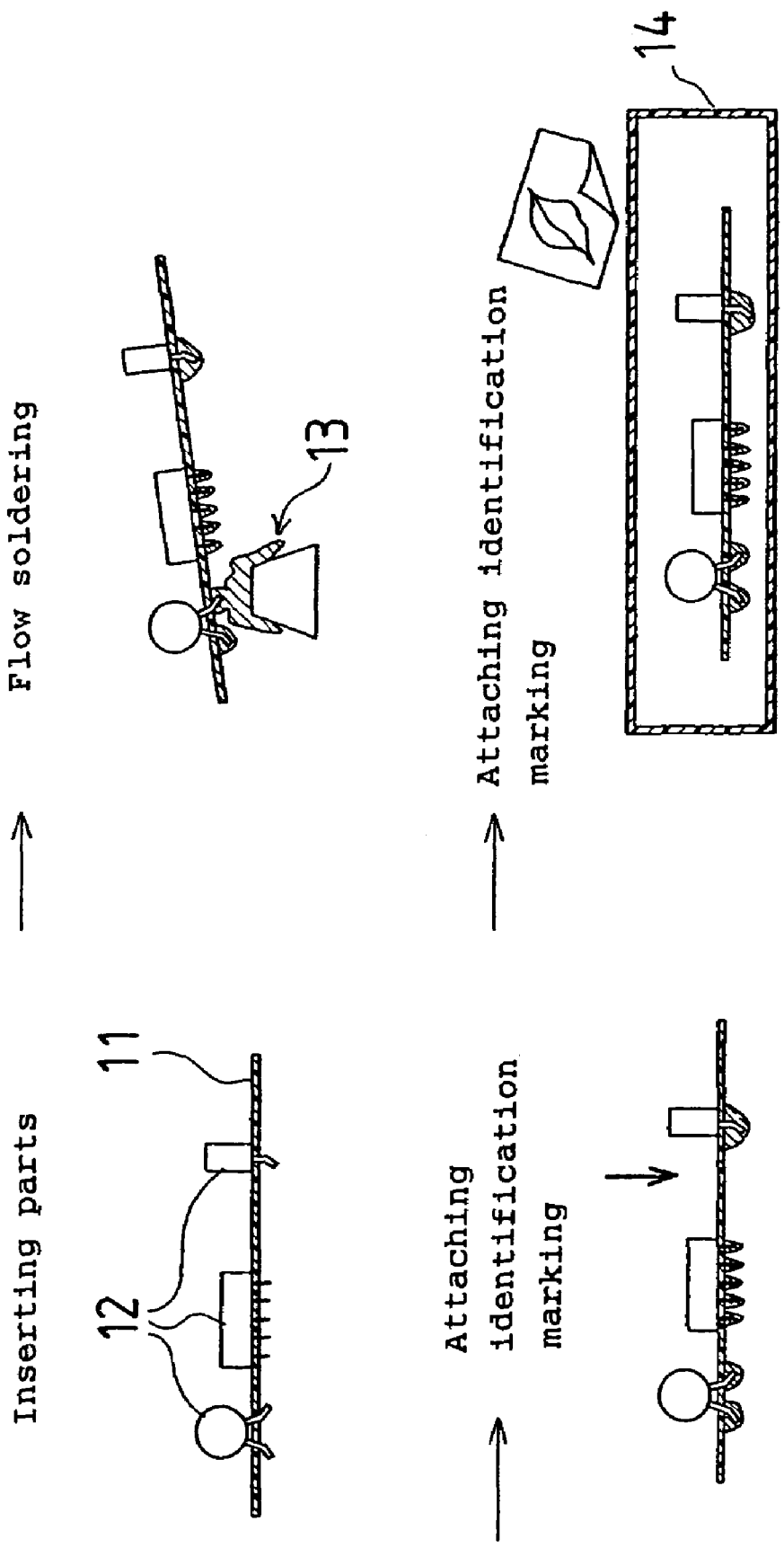
FIG. 2 is a picture illustrating the steps of a soldering method of various parts on a printed board for use in electric rice cooker by means of flow soldering process.

FIG. 2 is a picture illustrating the steps of a soldering method of various parts on a printed board for use in electric rice boiler by means of flow soldering process.

First, a part 12 whose electrode part has a coating of a lead free solder was inserted into a predetermined position of a printed board 11. Then, the printed board 11 was passed through a lead free solder jet 13 to solder the parts (this is called flow soldering). Subsequently, a marking integrated with an article design was printed on the printed board 11 as an identification marking indicating no inclusion of lead. An identical marking was also bonded to a housing 14 of an article containing the printed board 11 thus produced.

The resultant electric rice boiler could be readily identified to be free of lead by the printed identification marking when it was recovered after use, which simplified the subsequent recycling step.

EXAMPLE 3

Figure 3:
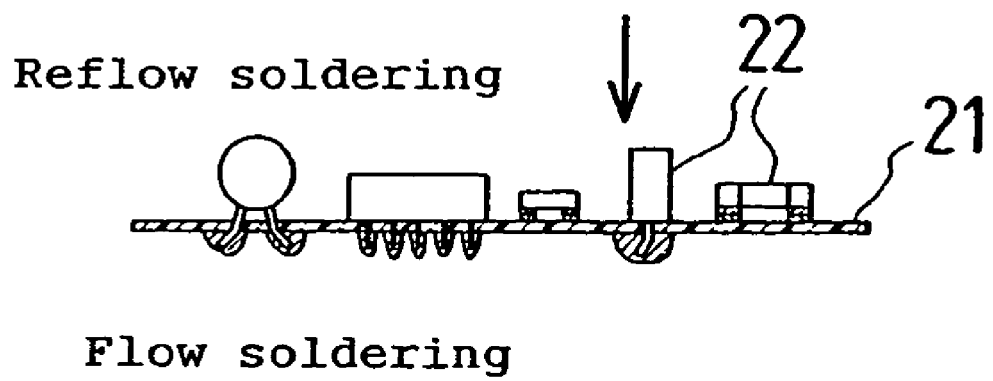
FIG. 3 is a picture illustrating the steps of a soldering method of various parts on a printed board for controlling automatic electronic parts mounting machine by using the flow and reflow soldering process in combination.
Figure 4:
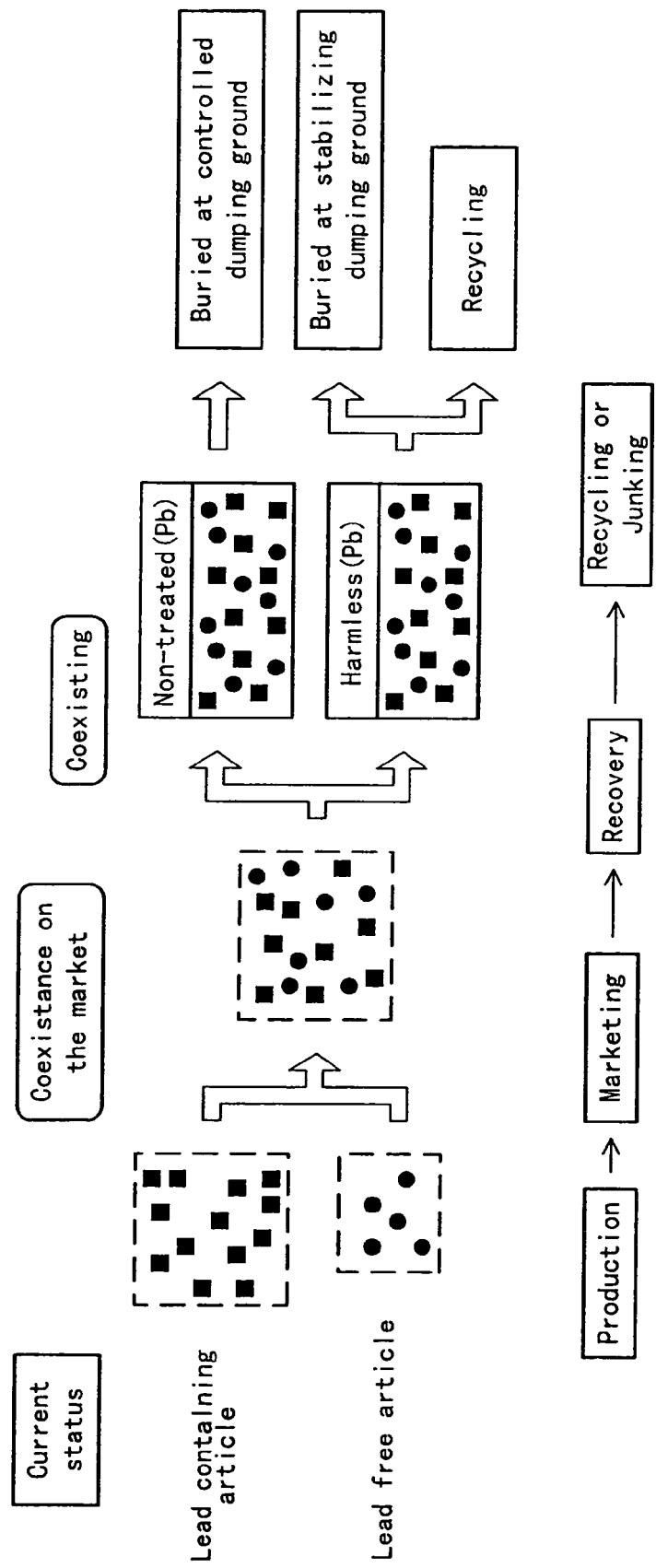
FIG. 4 is a flow chart illustrating a conventional series of processes of manufacturing, marketing, recovering and junking an article.

FIG. 3 is a picture illustrating the steps of a soldering method of various parts on a printed board for controlling automatic electronic part mounting machine by using the flow and reflow soldering process in combination.

A lead free part 22 was soldered on a printed board 21 by the flow and reflow soldering process in combination and an identification marking was inscribed on the resultant printed board 21.

The printed board could be readily identified to be free of lead by the inscribed identification marking when it was recovered after use, which simplified the subsequent recycling step.

INDUSTRIAL APPLICABILITY

As discussed above, the present invention can provide an article having a circuit soldered with parts and an electrical appliance including the same facilitating identification whether poisonous lead to human body is contained or not.

Of a variety of household electrical appliances installed with the article having a printed board, so far as the so-called four majors including television set, washing machine, refrigerator and vacuum cleaner are concerned, they have a domestic production yield of 20 millions per year, respectively. In view of this fact, on assumption that a million of lead free articles would be recovered randomizedly, together with lead containing articles in recycling junked household electrical appliances from year 2001, the identification marking attached to the lead free article and the electrical appliance including the same helps to identify them from the lead containing articles, thereby excluding them from the objects from which the solder is to be isolated for recovery. An expected cost reduction by the above accounts for 50 billion per year.

Since it is predicted that coexistence of lead free articles with lead containing articles will increase year by year, cost reduction achieved by the present invention is estimated to increase proportionally.

The invention claimed is:

1. A recycling method of wastes of an electrical appliance containing an article having a circuit soldered with parts soldered with a lead free solder and a housing accommodating said article wherein said housing has an IC carrying an identification information indicating presence of lead in said article or housing when said article or housing contains lead and indicating absence of lead in said article or housing when said article or housing does not contain lead, said identification information carrying information about the type and composition of the solder, kind of soldered parts, and a material of said article, said method comprising:

discriminating a first article having a circuit soldered with lead free parts from a second article having a circuit soldered with lead containing parts by means of said identification information, recovering, grinding and melting each of the first and second articles to separate materials of said first article and materials of said second article, recycling reusable valuables contained in said materials of said first article and said materials of said second article, and shredding a portion of said first and second article not containing the reusable valuables and burying the portion or treating the portion at a stabilizing dumping ground or a controlled dumping ground for disposal.

2. The recycling method of wastes of an electrical appliance in accordance with claim 1, further comprising, before said discriminating step:

classifying wastes of miscellaneous electrical appliances by the type of electrical appliance, identifying the presence or absence of lead by means of said identification information to discriminate a lead free electrical appliance from the lead containing second article, and disassembling each electrical appliance to remove the first and second article therefrom.

* * * * *